(12) United States Patent
Dong et al.

(10) Patent No.: US 11,349,267 B2
(45) Date of Patent: May 31, 2022

(54) CABLE CONNECTOR ASSEMBLY INCLUDING COAXIAL WIRES AND SINGLE CORE WIRES

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Yue-Jun Dong, Kunshan (CN); Feng-Jun Sun, Kunshan (CN); Jun Chen, Kunshan (CN); Yang-Tsun Hsu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/995,731

(22) Filed: Aug. 17, 2020

(65) Prior Publication Data
US 2021/0050694 A1 Feb. 18, 2021

(30) Foreign Application Priority Data
Aug. 15, 2019 (CN) .......................... 201910752965.9

(51) Int. Cl.
*H01R 24/60* (2011.01)
*H01R 12/53* (2011.01)
(Continued)

(52) U.S. Cl.
CPC ............. *H01R 24/60* (2013.01); *H01R 12/53* (2013.01); *H01R 13/6591* (2013.01);
(Continued)

(58) Field of Classification Search
CPC .... H01R 24/60; H01R 12/53; H01R 13/6591; H05K 1/111
See application file for complete search history.

(56) References Cited

U.S. PATENT DOCUMENTS 4,602,832 A * 7/1986 Cunningham ..... H01R 13/6592
439/108
5,122,065 A * 6/1992 Dudek ................. H01R 12/772
439/76.1
(Continued)

FOREIGN PATENT DOCUMENTS

CN 105702327 6/2016

*Primary Examiner* — Neil Abrams
(74) *Attorney, Agent, or Firm* — Ming Chieh Chang; Wei Te Chung

(57) ABSTRACT

A cable connector assembly includes: an electrical connector; a circuit board electrically connected to the electrical connector and including a first row of pads and a second row of pads located behind the first row of pads and separated from the first row of pads; and a cable electrically connected to the circuit board and including plural coaxial wires each including a center conductor and a shielding layer and plural single core wires each comprising a conductor; wherein the center conductors of the coaxial wires are soldered to the first row of pads of the circuit board, and the conductors of the single core wires and the shielding layers of the coaxial wires are soldered to the second row of pads of the circuit board.

18 Claims, 10 Drawing Sheets

(51) Int. Cl.
 *H01R 13/6591* (2011.01)
 *H05K 1/11* (2006.01)
 *H01R 13/66* (2006.01)
 *H01R 107/00* (2006.01)

(52) U.S. Cl.
 CPC ......... *H01R 13/6658* (2013.01); *H05K 1/111* (2013.01); *H01R 2107/00* (2013.01); *H05K 2201/09409* (2013.01); *H05K 2201/10189* (2013.01)

(56) References Cited

U.S. PATENT DOCUMENTS

| | | | | |
|---|---|---|---|---|
| 6,336,827 B1* | 1/2002 | Akama | ................... | H01R 12/62 439/607.46 |
| 8,133,071 B2* | 3/2012 | Huang | ................. | H01R 12/778 439/499 |
| 8,292,655 B1* | 10/2012 | Ling | ...................... | H01R 12/62 439/497 |
| 8,388,376 B2* | 3/2013 | Yamamoto | ............. | A61B 1/051 439/581 |
| 9,373,915 B1* | 6/2016 | Schulz | ............... | H01R 13/6594 |
| 9,478,878 B2* | 10/2016 | Wu | ........................ | H01R 12/53 |
| 9,692,187 B2* | 6/2017 | Qian | ...................... | H01R 13/665 |
| 9,751,144 B2* | 9/2017 | Wu | ........................ | B23K 26/22 |
| 9,979,145 B2* | 5/2018 | Wu | ........................ | H05K 1/111 |
| 10,103,453 B2* | 10/2018 | Pao | .................... | H01R 13/6595 |
| 10,326,214 B2* | 6/2019 | Ju | .......................... | H01R 24/22 |
| 10,367,294 B1* | 7/2019 | Smith | ............... | H01R 13/6592 |
| 10,411,374 B2* | 9/2019 | Tanaka | ................... | H01R 12/53 |
| 10,553,966 B1* | 2/2020 | Little | ................... | H01R 12/596 |
| 10,737,342 B2* | 8/2020 | Wu | ........................ | H01R 12/778 |
| 2011/0306244 A1* | 12/2011 | Zhang | ............. | H01R 13/65914 439/624 |
| 2018/0366852 A1* | 12/2018 | Yang | .................... | H01R 12/721 |
| 2021/0050694 A1* | 2/2021 | Dong | .................... | H05K 1/111 |
| 2021/0281017 A1* | 9/2021 | Yokota | .................. | H05K 1/181 |
| 2021/0296878 A1* | 9/2021 | Oyagi | .................... | H05K 1/117 |

* cited by examiner

CABLE CONNECTOR ASSEMBLY INCLUDING COAXIAL WIRES AND SINGLE CORE WIRES

BACKGROUND OF THE INVENTION

1. Field of the Invention

The present invention relates generally to a cable connector assembly, and more particularly to a cable connector assembly containing a circuit board.

2. Description of Related Arts

China patent No. CN105702327A (U.S. Pat. No. 9,979,145) discloses a cable connector assembly. The cable connector assembly comprising an electrical connector, a circuit board electrically connected to the electrical connector, and a cable electrically connected to the circuit board. The rear side of the circuit board is provided with a soldering pad connected with a cable, the cable includes coaxial wires and a single core wire, the coaxial cable can transmit high-speed signals, all the cables are soldered side by side to the same row of soldering pad on the circuit board, the tight arrangement of cables is easy to cause the possibility of empty soldering, In addition, the signal transmission path on the circuit board is too long, which affects the performance of signal transmission, At the same time, the overall volume of the cable connector assembly is relatively large.

An improved cable connector assembly is desired.

SUMMARY OF THE INVENTION

A main object of the present invention is to provide a cable connector assembly, the cable is soldered reliably on the circuit board, and the transmission distance of the coaxial wire on the circuit board is short, thereby increasing the performance of high-speed signal transmission of the coaxial wire, and At the same time the volume of the entire cable connector assembly is small.

To achieve the above-mentioned object, a cable connector assembly comprises: an electrical connector; a circuit board electrically connected to the electrical connector and including a first row of pads and a second row of pads located behind the first row of pads and separated from the first row of pads; and a cable electrically connected to the circuit board and including plural coaxial wires each including a center conductor and a shielding layer and plural single core wires each comprising a conductor; wherein the center conductors of the coaxial wires are soldered to the first row of pads of the circuit board, and the conductors of the single core wires and the shielding layers of the coaxial wires are soldered to the second row of pads of the circuit board.

Compared to the prior art, the present invention has the advantage that not only improves the soldering stability, but also improves the high-speed signal transmission performance of the coaxial line, and effectively reduces the overall volume of the cable connector assembly.

DETAILED DESCRIPTION OF THE PREFERRED EMBODIMENT

Figure 1:
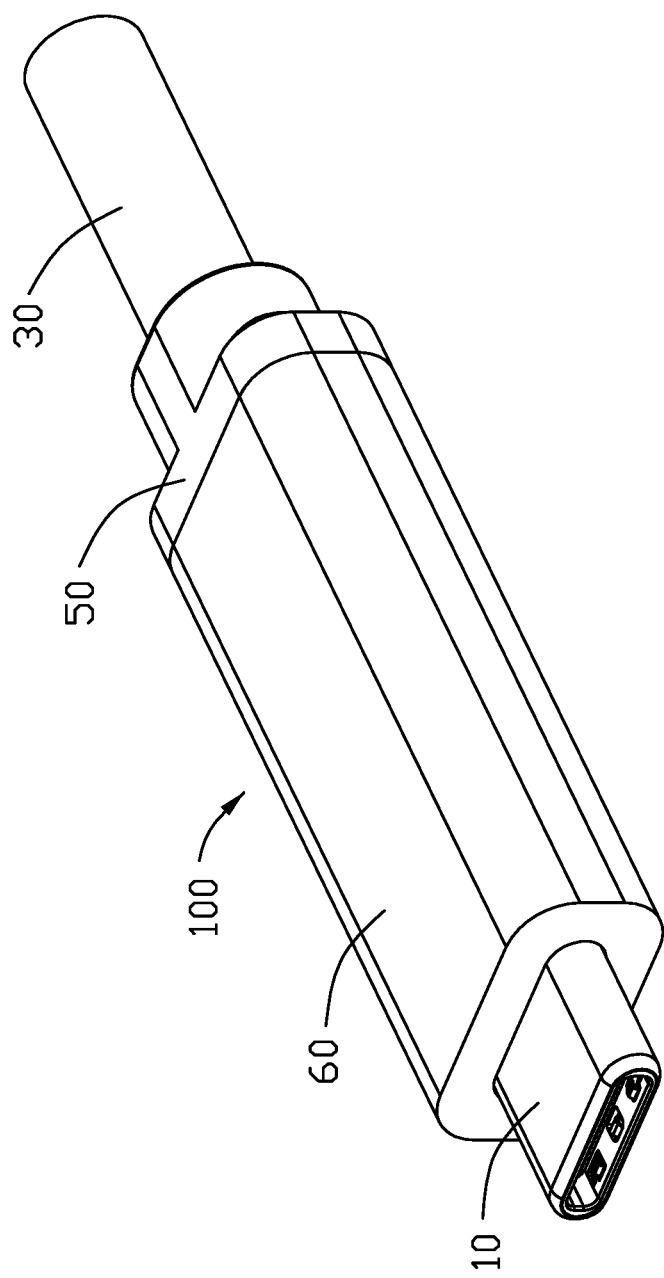
FIG. 1 is a perspective view of the cable connector assembly according to a preferred embodiment of the present invention.
Figure 2:
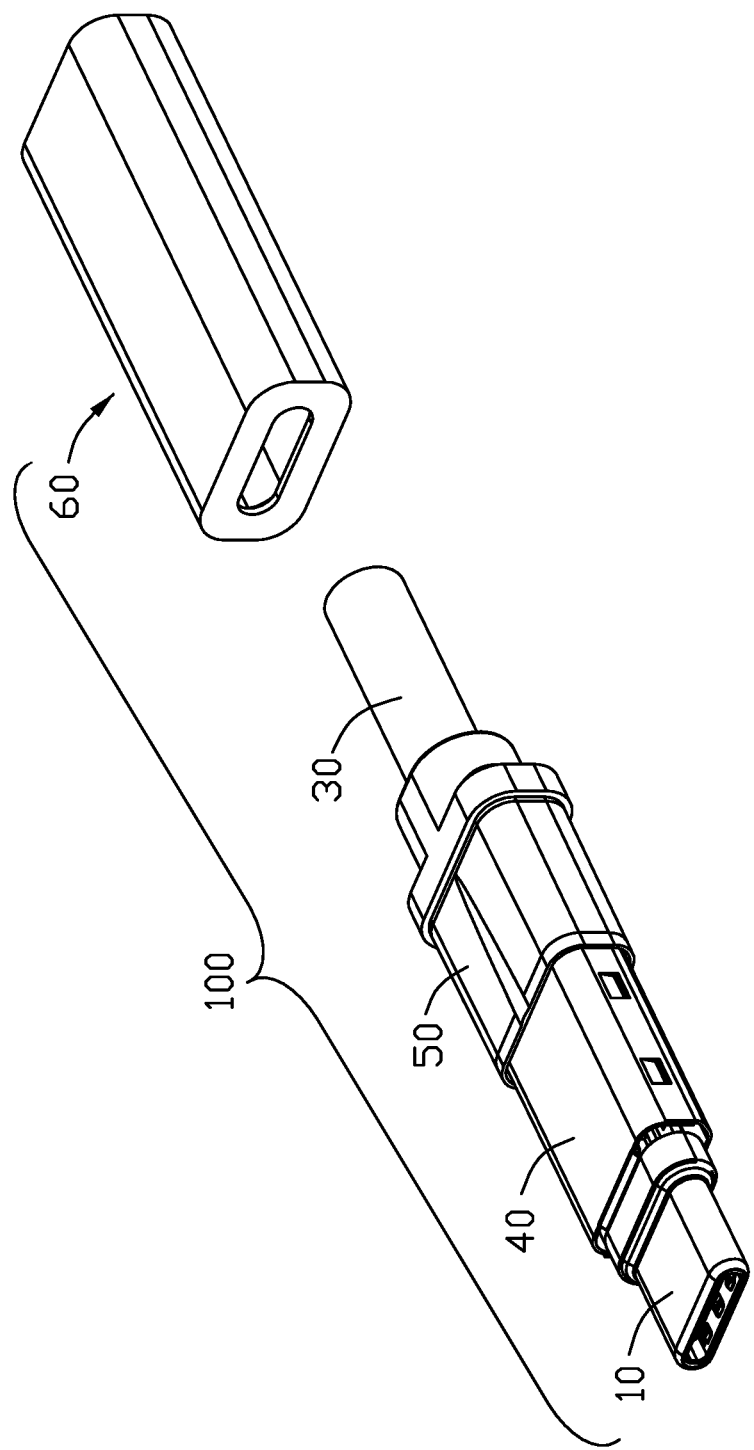
FIG. 2 is an exploded view of the cable connector assembly of FIG. 1.
Figure 3:
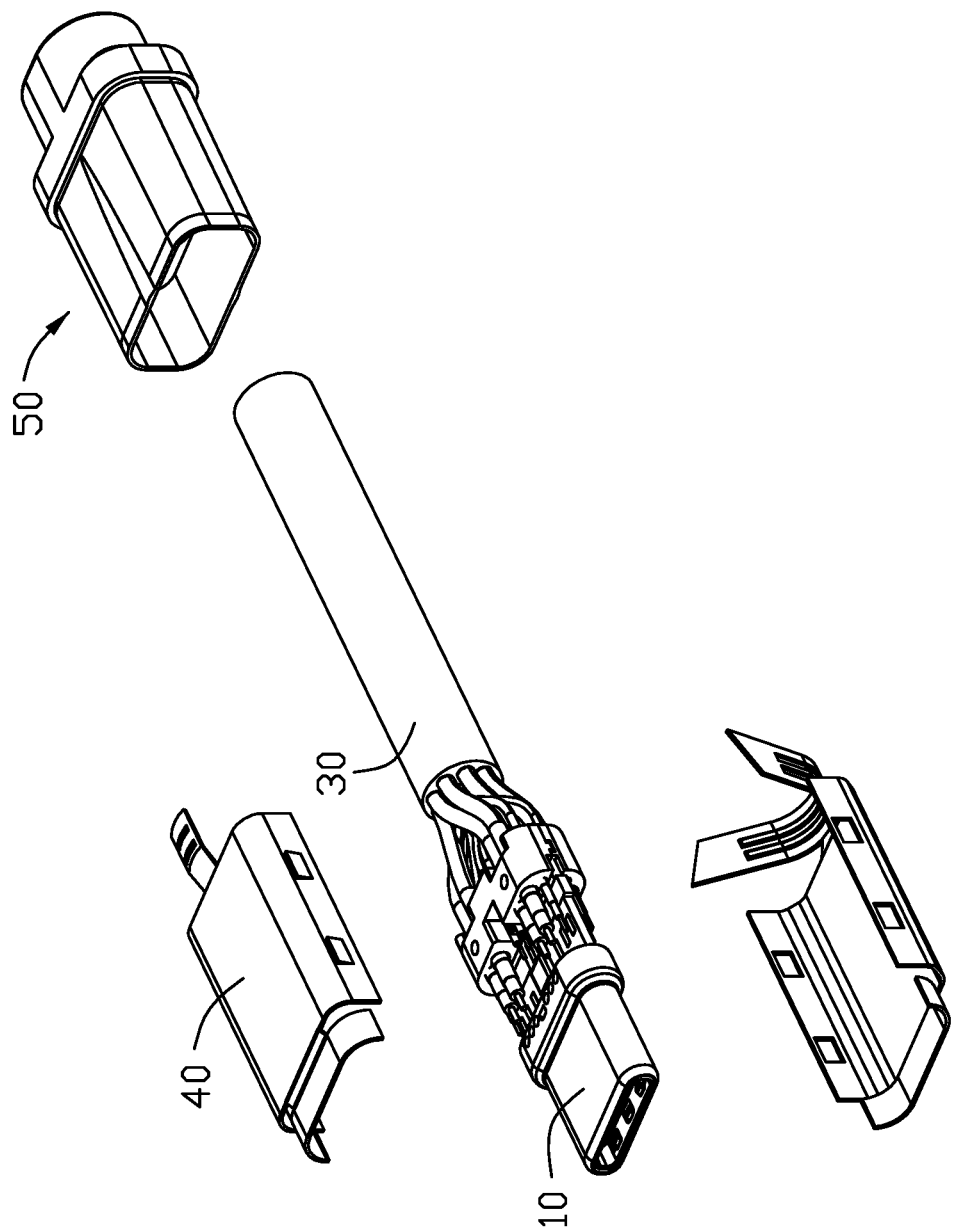
FIG. 3 is a further exploded view of the cable connector assembly of FIG. 1.
Figure 4:
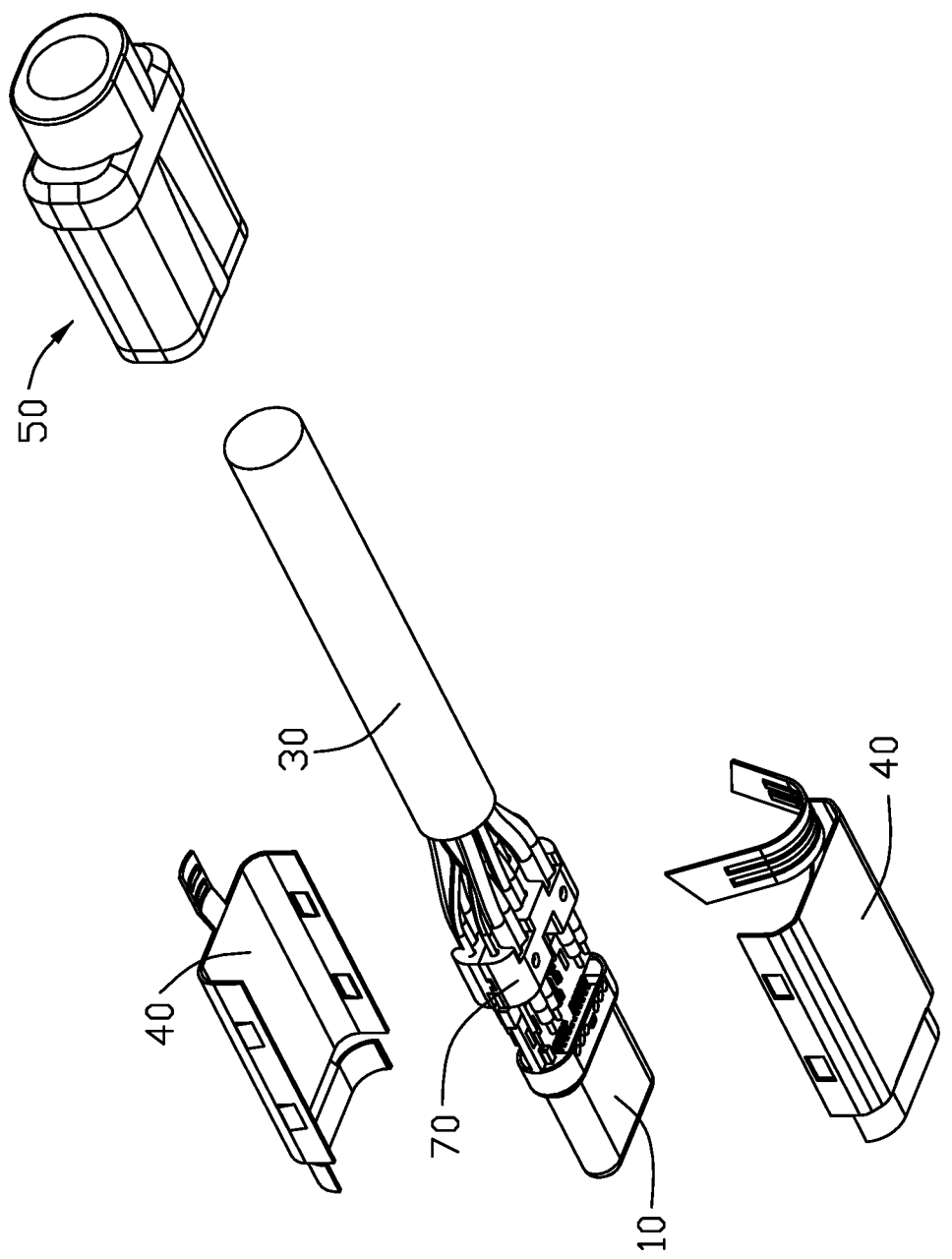
FIG. 4 is another exploded view of the cable connector assembly of FIG. 3.
Figure 5:
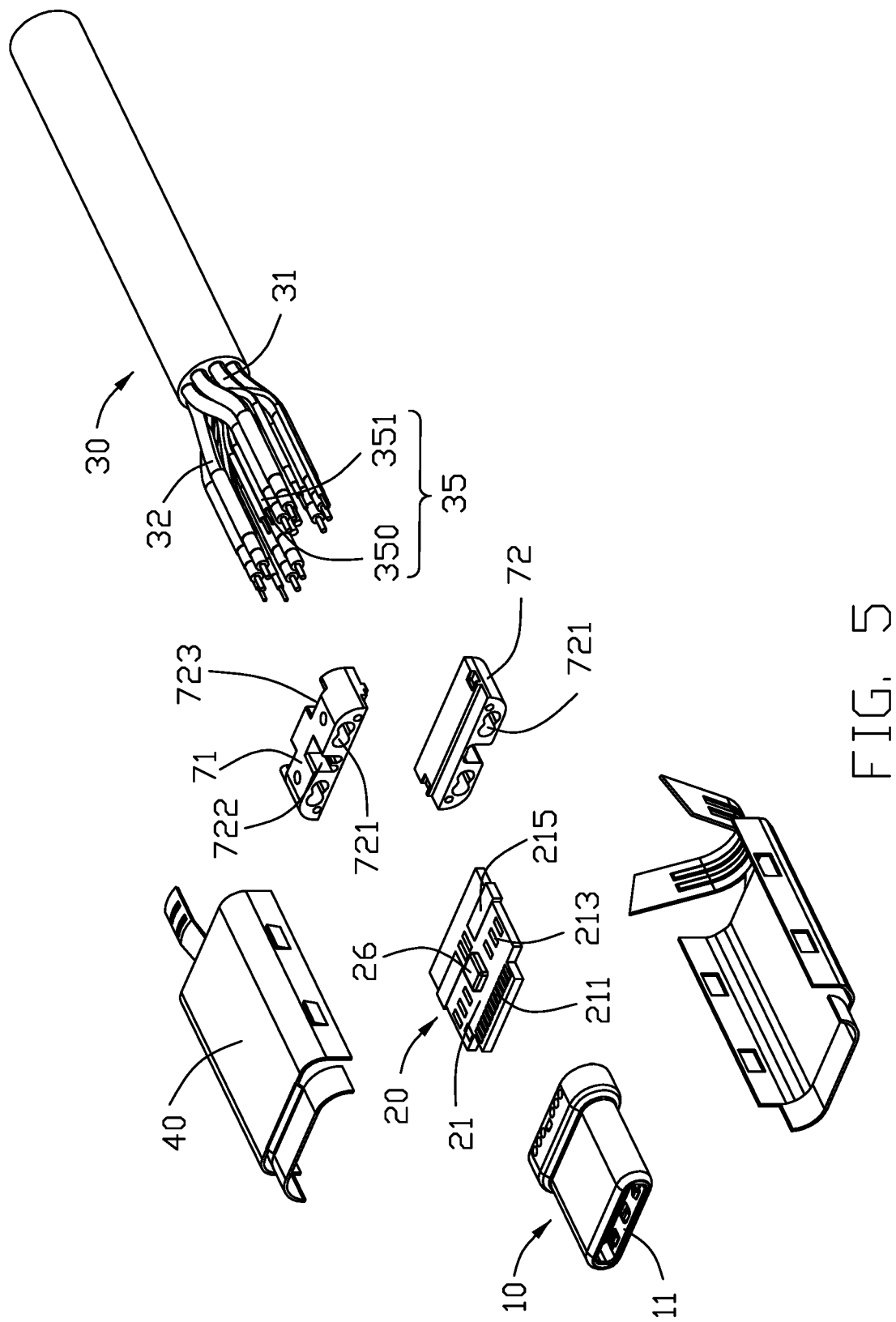
FIG. 5 is a further exploded view of the cable connector assembly of FIG. 3.
Figure 6:
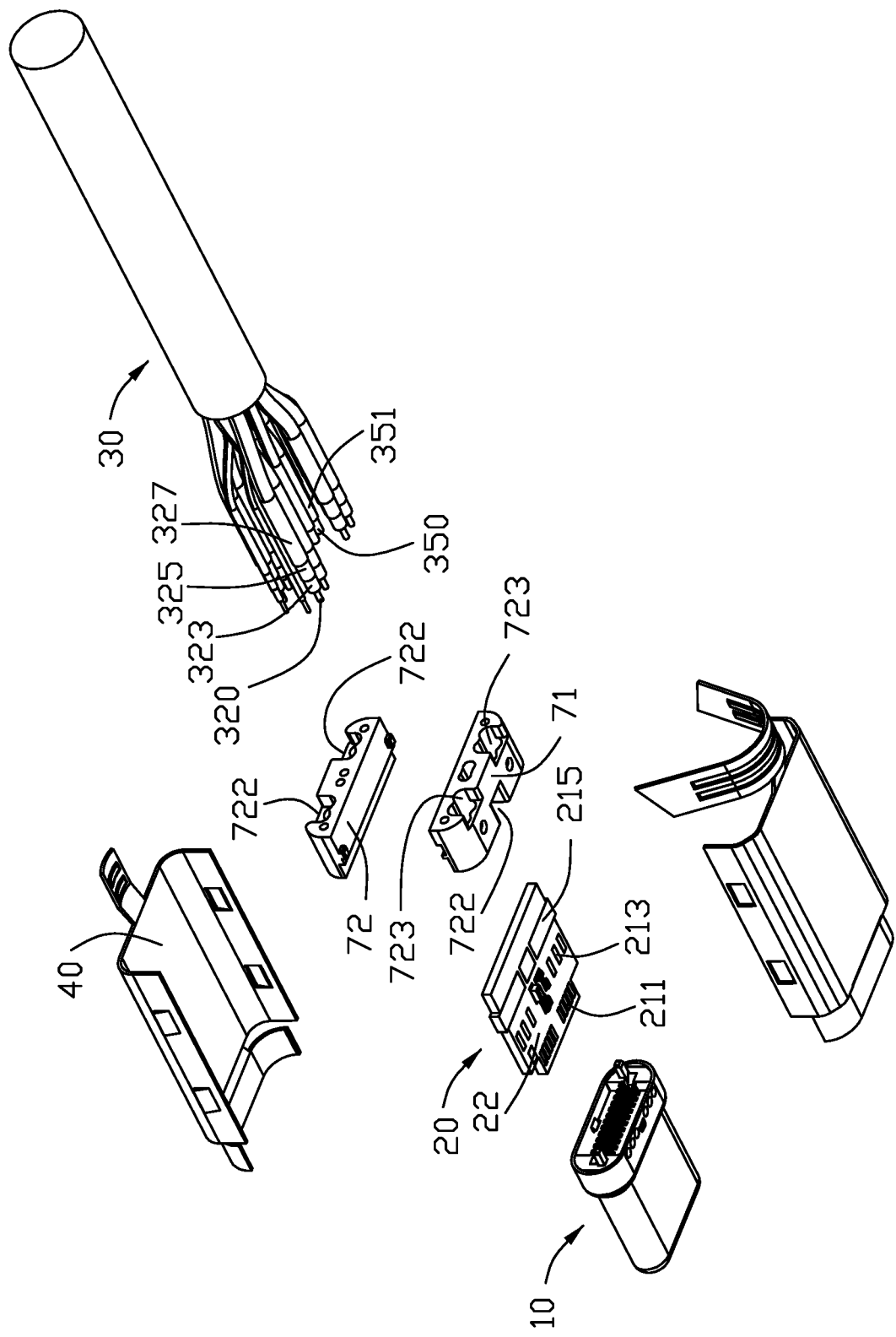
FIG. 6 is another exploded view of cable connector assembly of FIG. 5.
Figure 7:
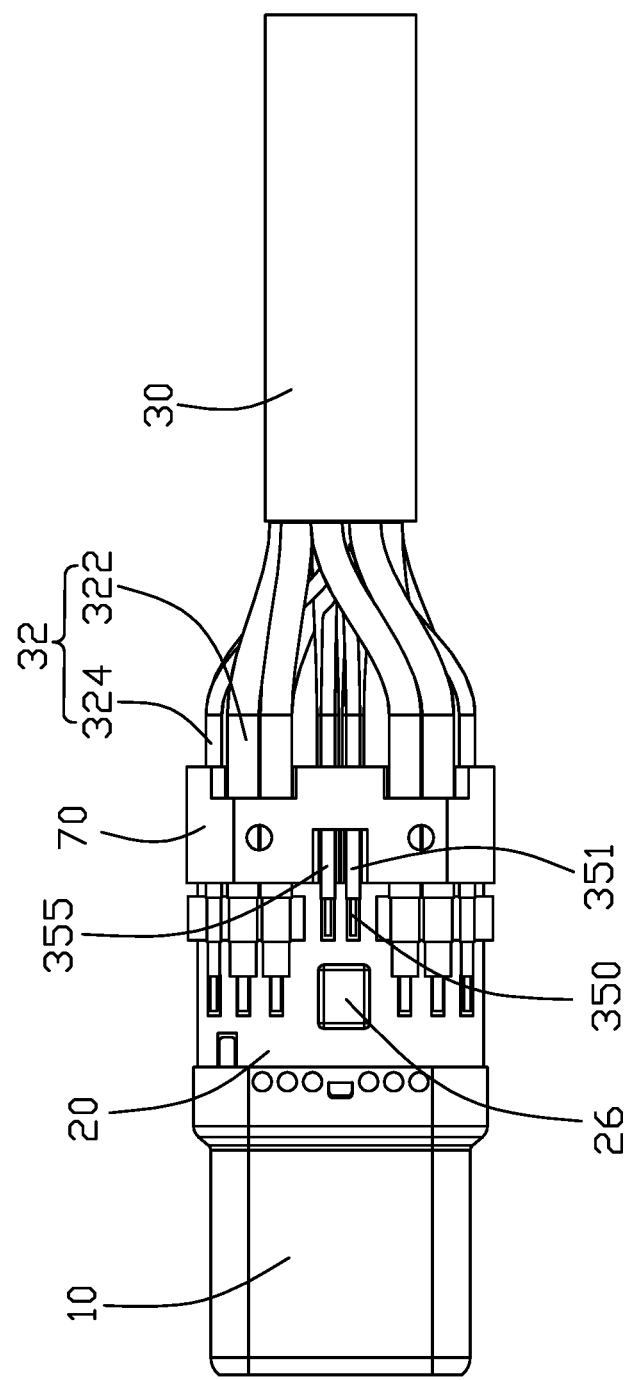
FIG. 7 is a top view of the cable connector assembly of FIG. 3 with the shell and inner mold removed.
Figure 8:
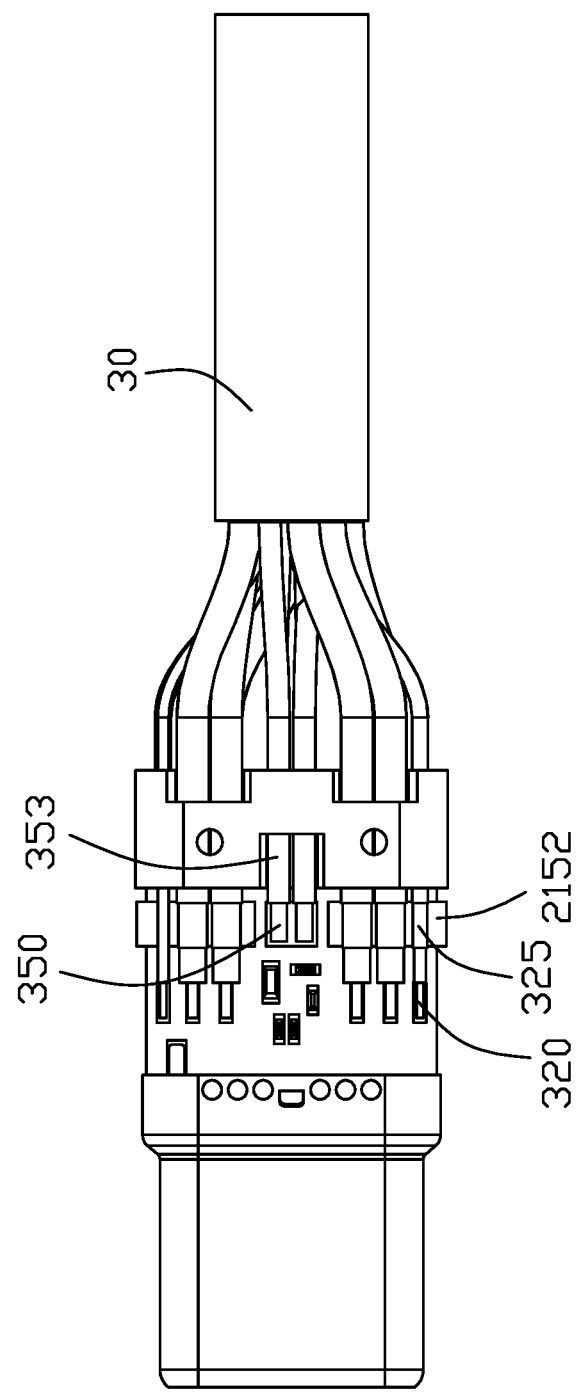
FIG. 8 is a bottom view of the cable connector assembly of FIG. 7.
Figure 9:
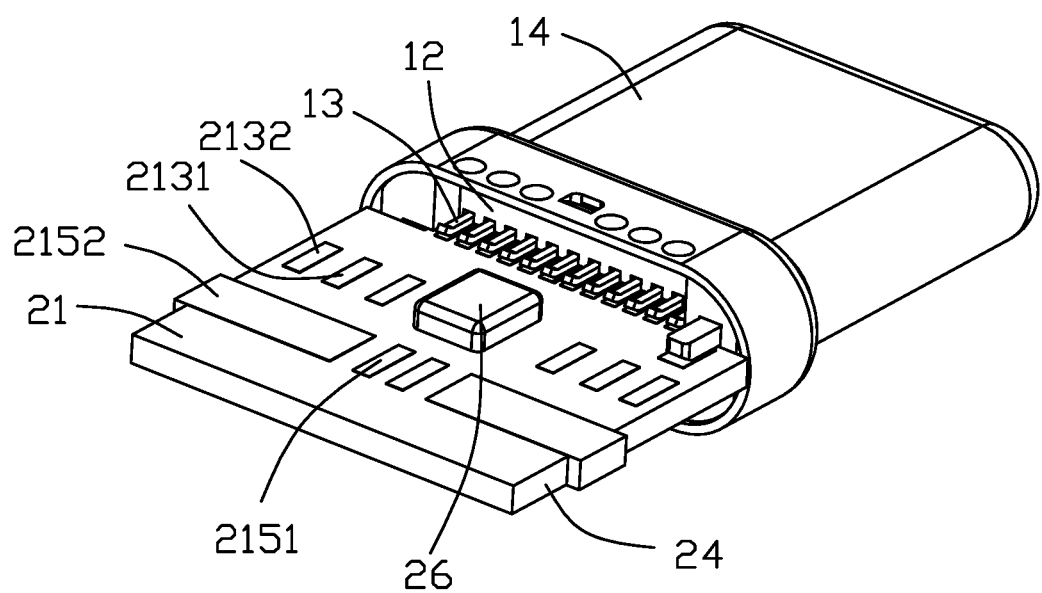
FIG. 9 is a perspective view of the electrical connector and circuit board of the cable connector assembly of FIG. 1.
Figure 10:
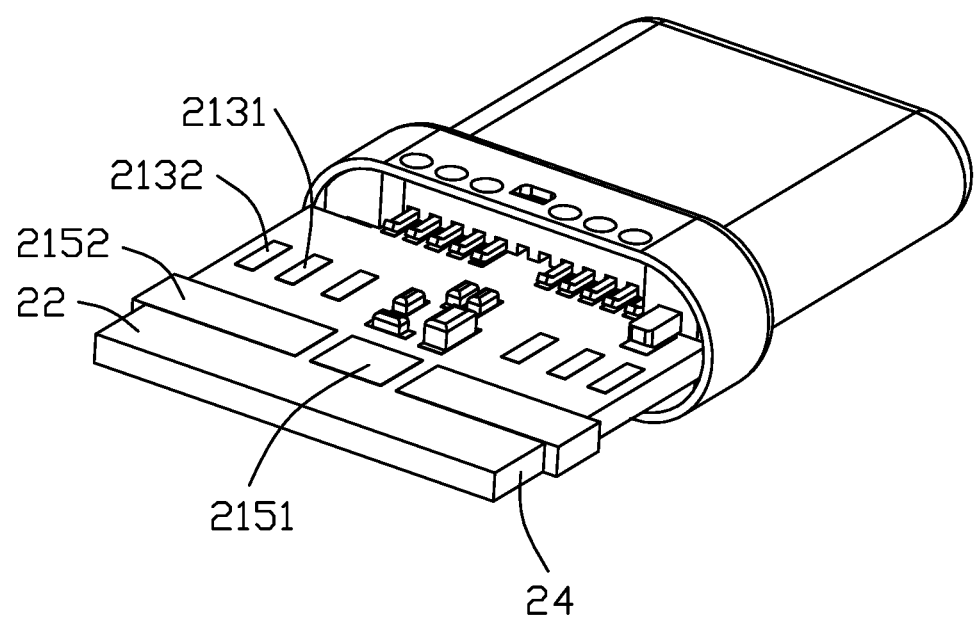
FIG. 10 is another perspective view of the electrical connector and circuit board of the cable connector assembly of FIG. 9.

Referring to FIGS. 1-10, a cable connector assembly 100 of the present invention is shown and can be mated with a mating connector in two orientations. The cable connector assembly 100 comprises an electrical connector 10, a circuit board 20 electrically connected to the electrical connector 10, and a cable 30 electrically connected to the circuit board 20. Also shown are a metal shell 40 covering the rear of the electrical connector 10 and the front of the cable 30 and housed the circuit board 20, an inner mold 50 covering the rear of the metal shell 40 and the front of the cable 30, an insulating hosing 60 provided outside the metal shell 40 and in the front of the inner mold 50, and a cable management block 70 for positioning the cable 30. The cable connector assembly 100 complies with Thunderbolt 3.0 specifications, and the transmission speed of each channel can reach 10 Gbps or even higher.

The electrical connector 10 includes a front mating end 11, which can be mated with the mating connector in both forward and reverse directions. The electrical connector 10 includes an insulating body 12, a plurality of conductive terminals 13 held in the insulating body 12, and a metal housing 14 disposed outside the insulating body 12. The conductive terminal 13 includes an upper row of conductive terminals and a lower row of conductive terminals. The connector 10 further includes a rear connecting end (not labeled) for connecting to the printed circuit board 20.

The cable 30 comprises a plurality of core wires 31, and the core wires 31 includes coaxial wires 32 and single core wires 35. Each of the coaxial wires 32 includes a center conductor 320, an inner insulating layer 323 covering the center conductor 320, a shielding layer 325 covering the inner insulating layer 323, and an outer insulating layer 327 covering the outside the shielding layer 325. The coaxial wires 32 includes a first type of coaxial wire 322 and a second type of coaxial wire 324, and the radial dimension of the first type of coaxial wire 322 is larger than the radial dimension of the second type of coaxial wire 324, that is, the cross-sectional diameter dimension of the first coaxial wire 322 is greater than the cross-sectional diameter dimension of the second coaxial wire 324. The rate of the signal transmitted by the first coaxial wire 322 is greater than the rate of the signal transmitted by the second coaxial wire 324. In this embodiment, the first type of coaxial wire 322 is a high speed signal wire used to transmit high speed signals, e.g., the USB 3.0 differential pair. The cable 30 include four pairs, each pair can be used to transmit one pair of differential signals, and can transmit four pairs of high-speed differential signals in all. The second coaxial wire 324 is used for a low speed signal wire for transmitting low speed signals. Each of the single core wire 35 includes a conductor 350 and an insulating layer 351 covering the outside of the conductor 350. The single core wires 35 includes power core wires 353 for transmitting power and low speed signal wires 355 for transmitting USB2.0 signals. The cable connector assembly 100 further includes a cable management block 70 for fixing the cable 30. The cable management block 70 including an upper cable management block 71 and a lower cable management block 72 assembled with each in the vertical direction. Each of the upper cable management block 71 and the lower cable management block 72 comprise through holes 721 in the front-rear direction. Before soldering to the circuit board 20, the cable 30 is divided into upper row and lower row, and respectively passes through the holes 721 of the corresponding upper cable management block 71 and the lower cable management block 72. Each of the cable management block 71, 72 forms a recess 722 in a front edge so as to facilitate management of the corresponding single core wires of which the corresponding inner conductors are soldered to the corresponding pads of the printed circuit board closer to the cable management block than those connecting to the inner conductors of the coaxial wires. Similarly, each of cable management block 71, 72 further includes a pair of recesses 723 in a rear edge so as to facilitate management of the coaxial wires 322. The cable 30 is fixed to the upper cable management block 71 and the lower cable management block 72 through a process such as dispensing. The front end of the cable 30 passes through the holes 721 of the cable management block 70 and is exposed at the front end of the cable management block 70 to facilitate soldering of the cable 30 to the circuit board 20.

The circuit board 20 includes a first surface 21, a second surface 22 opposite to the first surface 21, and two side surfaces 24 connecting the first surface 21 and the second surface 22. Each of the first surface 21 and the second surface 22 of the circuit board 20 include a row of terminal pads 211 at the front end, a first row of pads 213 behind the terminal pads 211, and a second row of pads 215 behind the first row of pads 213. The second row of pad 215 and the first row of pads 213 are spaced apart. The circuit board 20 is also provided with a number of electronic components 26 that are at least partially disposed between the first row of pads 213 on the circuit board 20. In this embodiment, the electronic component 26 is located in the middle of the first row of pads 213. The upper row of conductive terminals and the lower row of conductive terminals are respectively soldered to the terminal pads 211. The first row of pads 213 on the first surface 21 and the second surface 22 of respectively include first pads 2131 on each side of the electronic component 26 and second pads 2132 on the outside of the each first pad 2131, the second pads 2132 are respectively located on the outer regions on each side of the circuit board 20 in the lateral direction. Each of the second row of pads 215 located on the first surface 21 and the second surface 22 include conductor pads 2151 located in the middle and grounding pads 2152 located on the left and right sides of the conductor pad 2151. The grounding pads 2152 on each side are connected together as a whole. The grounding pads 2152 on each side extend outward beyond the corresponding sides surface 24 of the circuit board 20, respectively. The first pads 2131 and the second pads 2132 are symmetrically arranged in the first row of pads 213 on the first surface 21 and the second surface 22 of the circuit board 20. The conductor pads 2151 and the ground pads 2152 are symmetrically arranged in the second row of pads 215 on the first surface 21 and the second surface 22 of the circuit board 20

The center conductors 320 of the coaxial wires 32 is solder to the first row of pads 213, and the center conductors 320 of the first type of coaxial wires 322 is solder to the first pad 2131, and the center conductors 320 of the second type of coaxial wires 324 is solder to the second pad 2132. In this way, the second coaxial wire 324 is located outside the first coaxial wire 322 of the circuit board 20. The first type of coaxial wire 322 is a high speed signal wire used to transmit high speed signals. High speed signals are transmitted in differential pairs, so the first type of coaxial wire 322 is arranged in pairs. The arrangement order of the coaxial wires 32 in the lateral direction on the circuit board 20 is: a second type coaxial wire 324, a pair of first type coaxial wires 322, a pair of the first type coaxial wires 322 and a second type of coaxial wire 324. The conductors 350 of the single core wires 35 and the shield layers 325 of the coaxial wires 32 are soldered to the second row of pads 215, and the conductors 350 of the single core wires 35 is soldered to the conductor pad 2151 at the middle position, the shielding layers 325 of the coaxial wires 32 is soldered to the ground pad 2152. In this way, the single core wires 35 are soldered to the middle position of the circuit board 20. The coaxial wires 32 and the single core wires 35 are symmetrically arranged on the first surface 21 and the second surface 22 of the circuit board 20, that is, at the position where the coaxial wires 32 is soldered on the first surface 21, the opposite second surface 22 is also soldered with the coaxial wires 32, and where the single core wires 35 is soldered on the first side, the opposite second surface 22 is also soldered with the single core wires 35. The first type of coaxial wires 322 and the second type of coaxial wires 324 are symmetrically arranged on the first surface 21 and the second surface 22 of the circuit board 20, that is, the position where the first type coaxial wire 322 is soldered on the first surface 21 of the circuit board 20, the opposite second surface 22 also corresponds to the first type coaxial wire 322, and at the position where the second type coaxial wire 324 is soldered on the first surface 21 the opposite second surface 22 is also soldered with the second coaxial wire 324.

The grounding pads 2152 extend outwards beyond the corresponding sides surface 24 of the circuit board 20 respectively, increasing the area of the grounding pads 2152 so that the shielding layer 325 has sufficient contact area when soldered to the grounding pads 2152 to ensure the shielding layer 325 is not empty soldering, increases soldering quality and grounding effect, and ensures the stability of soldering. In addition, when there are electronic components 26 on the circuit board 20, the cable 30 is divided into two rows of front and rear, the coaxial wires 32 is soldered to the first row of pads 213, the single core wires 35 and the shield layers 325 of the coaxial wires 32 soldering to the second row of pads 215, which not only increases the soldering space of the cable 30 soldered on the circuit board 20, but also reduces the space of the entire cable connector assembly 100, making the structure of the entire cable connector assembly 100 even more compact. Because the high speed signal is transmitted in the coaxial wires 32, soldering the center conductors 320 of the coaxial wires 32 to the first row of pads 213 closer to the electrical connector 10 shortens the transmission path of the high-speed signal in the circuit board 20, which is effective improve the transmission performance of high speed signals.

The assembly method of the cable connector assembly 100 includes the following steps:

Provide the electrical connector 10.
Provide the circuit board 20.
Provide the cable 30.
Provide the cable management block 70. The cable 30 is divided into upper rows and lower row, and passes through the corresponding holes 721 of the upper and lower cable management blocks 71 and 72 respectively. And expose the cable 30 to the front end of the cable management block 70; keep the front ends of the coaxial wires 32 aligned so that the length of the coaxial wires exposed to the front end of the cable management block 70 remains the same, and the coaxial wires 32 are arranged side by side. Fix the conductors of the single core wires 35 and shield layers 325 of the coaxial wire in the same row, and fix the cable 30 to the cable management block 70.

Solder the center conductors 320 of the coaxial wires 32 of the upper row of cables to the first row of pads 213 of the first surface 21 of the circuit board 20 at the same time.

Solder the shield layers 325 of the coaxial wires 32 of the upper row of wire and the conductors 350 of the single core wires 35 of the upper row of wire to the second row of pads 215 of the first surface 21 of the circuit board 20 at the same time. Simultaneously solder the shield layers 325 of the coaxial wires 32 of the upper row of wire and the conductors 350 of the single cores 35 of the upper row of wires to the second row of pads 215 on the first surface 21 of the circuit board 20. Solder the center conductors 320 of the coaxial wires 32 of the lower row of wires to the first row of pads 213 on the second surface 22 of the circuit board 20 at the same time. Simultaneously solder the shield layers 325 of the coaxial wires 32 of the lower row of wires and the conductors 350 of the single core wires 35 of the lower row of wires to the second row of the pads 215 on the second surface 22 of the circuit board 20.

In the present invention, the shield layers 325 of the coaxial wires 32 and the conductors 350 of the single core wires 35 are arranged in the same row, During soldering, the shielding layers 325 and the conductors 350 can be soldered to the circuit board 20 at the same time just for one time, reducing soldering time.

The above is only some of the embodiments of the present invention, but not all of the embodiments. Any equivalent changes to the technical solutions of the present invention by those skilled in the art by reading the description of the present invention are covered by the claims of the present invention.

What is claimed is:

1. A cable connector assembly comprising:
an electrical connector;
a circuit board electrically connected to the electrical connector and comprising:
a first row of pads; and
a second row of pads located behind the first row of pads and separated from the first row of pads; and
a cable electrically connected to the circuit board and comprising:
a plurality of coaxial wires each including a center conductor and a shielding layer; and
a plurality of single core wires each comprising a conductor; wherein
the center conductors of the coaxial wires are soldered to the first row of pads of the circuit board, and the conductors of the single core wires and the shielding layers of the coaxial wires are soldered to the second row of pads of the circuit board; and
the plurality of coaxial wires include first coaxial wires and second coaxial wires, a radial dimension of the first coaxial wire is greater than a radial dimension of the second coaxial wire, and signal transmission rate by the first coaxial wire is greater than signal transmission rate by the second coaxial wire.

2. The cable connector assembly as claimed in claim 1, wherein the circuit board includes electronic components at least partially disposed between the first row of pads on the circuit board.

3. The cable connector assembly as claimed in claim 1, wherein the second coaxial wires are located at outer sides of the first coaxial wires on the circuit board.

4. The cable connector assembly as claimed in claim 1, wherein a left and right outermost sides of the second row of pads extend outward beyond corresponding outermost sides of the circuit board, respectively.

5. The cable connector assembly as claimed in claim 1, wherein the circuit board includes a first surface and a second surface opposite to the first surface, the first row of pads and the second row of pads are disposed on both the first surface and the second surface, and the coaxial wires and the single core wires on each of the first surface and the second surface of the circuit board are symmetrically arranged.

6. The cable connector assembly as claimed in claim 1, wherein the electrical connector includes a mating end for mating with a mating connector in two orientations.

7. An electrical cable connector assembly comprising:
an electrical connector defining an insulative housing with a front mating end and a rear connecting end along a front-to-back direction;
a plurality or terminals retained in the housing;
a printed circuit board disposed at the rear connecting end and defining opposite first and second surfaces in a vertical direction perpendicular to the front-to-back direction;
a cable including at least four pairs of large coaxial wires for high speed signal transmission of USB 3.0 differential pair wherein each of the large coaxial wires includes an inner conductor and a shielding layer coaxially surrounding the inner conductor, a pair of large single core wires for power transmission, and a pair of small single core wires for low speed signal transmission of USB 2.0 signals wherein each signal core wires includes an inner conductor only without a shielding layer thereon and the inner conductor of the large single core wire is diametrically larger than that of the small signal core wire;
a plurality of pads formed on each of the first and second surfaces, said pads including a front row of pads mechanically and electrically connected to the terminals, and a rear row of pads mechanically and electrically connected to the shielding layers of the large coaxial wires and the inner conductors of the large single core wires and those of the small single core wires, respectively.

8. The electrical cable connector assembly as claimed in claim 7, wherein the rear row of pads connecting to the pair of large single core wires on the first surface are aligned, in the vertical direction, with the rear row of pads connecting to the pair of small single core wires on the second surface.

9. The electrical cable connector assembly as claimed in claim 8, wherein in said four pairs of large coaxial wires, two pairs are connected to the rear row of pads on the first surface and located, in a transverse direction perpendicular to both the front-to-back direction and the vertical direction, by two sides of the rear row of pads connected to the pair of large single core wires, and the other two pairs are connected to the rear row of pads on the second surface and located, in the transverse direction, by two sides of the rear of pads connected to the pair of small single core wires.

10. The electrical cable connector assembly as claimed in claim 7, wherein said pads further includes a middle row of pads between the front row of pads and the rear row of pads in the front-to-back direction, and the inner conductors of the large coaxial wires are mechanically and electrically connected to the middle row of pads, respectively.

11. The electrical cable connector assembly as claimed in claim 7, wherein said cable further includes a plurality of small coaxial wires located, in a transverse direction perpendicular to both the front-to-back direction and the vertical direction, on outer sides of the corresponding large coaxial wires, respectively, and each of said small coaxial wires includes an inner conductor and an outer shielding layer surrounding the corresponding inner conductor for low speed signal transmission, and the inner conductor of the small coaxial wire is smaller than that of the large coaxial wire.

12. The electrical cable connector assembly as claimed in claim 11, wherein the shielding layers of the small coaxial wires are mechanically and electrically connected to the rear row of pads, respectively.

13. The electrical cable connector assembly as claimed in claim 12, wherein said pads further includes a middle row of pads between the front row of pads and the rear row of pads in the front-to-back direction, and the inner conductors of the large coaxial wires and those of the small coaxial wires are mechanically and electrically connected to the middle row of pads, respectively.

14. The electrical cable connector assembly as claimed in claim 12, wherein the rear row of pads sidewardly protrude beyond corresponding side face of the printed circuit board for complying with the shielding layers of the small coaxial wires.

15. The electrical cable connector assembly as claimed in claim 7, further including a cable management block to retain the corresponding wires, wherein the cable management block is located adjacent to a rear end of the printed circuit board, and in the cable management block, the large coaxial wires are located by two sides of the large single core wires and the small single core wires in a transverse direction perpendicular to the front-to-back direction and the vertical direction.

16. The electrical cable connector assembly as claimed in claim 15, wherein a notch is formed in a front edge of the cable management block corresponding to either the pair of large single core wires or small single core wires.

17. A cable connector assembly comprising:
an electrical connector;
a circuit board electrically connected to the electrical connector and comprising:
a first row of pads; and
a second row of pads located behind the first row of pads and separated from the first row of pads; and
a cable electrically connected to the circuit board and comprising:
a plurality of coaxial wires each including a center conductor and a shielding layer; and
a plurality of single core wires each comprising a conductor; wherein
the center conductors of the coaxial wires are soldered to the first row of pads of the circuit board, and the conductors of the single core wires and the shielding layers of the coaxial wires are soldered to the second row of pads of the circuit board; and
a left and right outermost sides of the second row of pads extend outward beyond corresponding outermost sides of the circuit board, respectively.

18. The cable connector assembly as claimed in claim 17, wherein the circuit board includes a first surface and a second surface opposite to the first surface, the first row of pads and the second row of pads are disposed on both the first surface and the second surface, and the coaxial wires and the single core wires on each of the first surface and the second surface of the circuit board are symmetrically arranged.

* * * * *